United States Patent
Guo et al.

(10) Patent No.: US 12,185,562 B2
(45) Date of Patent: Dec. 31, 2024

(54) ORGANIC ELECTROLUMINESCENT DEVICE

(71) Applicant: GU' AN YEOLIGHT TECHNOLOGY CO., LTD., Hebei (CN)

(72) Inventors: Lixue Guo, Langfang (CN); Yingguang Zhu, Langfang (CN); Guohui Zhang, Langfang (CN); Yonglan Hu, Langfang (CN); Jing Xie, Langfang (CN)

(73) Assignee: GU' AN YEOLIGHT TECHNOLOGY CO., LTD., Hebei (CN)

( * ) Notice: Subject to any disclaimer, the term of this patent is extended or adjusted under 35 U.S.C. 154(b) by 294 days.

(21) Appl. No.: 17/779,539

(22) PCT Filed: Dec. 17, 2020

(86) PCT No.: PCT/CN2020/137407
§ 371 (c)(1),
(2) Date: May 24, 2022

(87) PCT Pub. No.: WO2021/121344
PCT Pub. Date: Jun. 24, 2021

(65) Prior Publication Data
US 2022/0416199 A1    Dec. 29, 2022

(30) Foreign Application Priority Data
Dec. 18, 2019   (CN) .......................... 201911313157.9

(51) Int. Cl.
*H01L 51/50*    (2006.01)
*H10K 50/814*   (2023.01)
(Continued)

(52) U.S. Cl.
CPC ......... *H10K 50/824* (2023.02); *H10K 50/814* (2023.02); *H10K 2102/102* (2023.02); *H10K 2102/103* (2023.02)

(58) Field of Classification Search
CPC ........................ H10K 50/824; H10K 50/814
See application file for complete search history.

(56) References Cited

U.S. PATENT DOCUMENTS

| 2008/0157654 A1 | 7/2008 | Cok |
| 2015/0243716 A1 | 8/2015 | Kwon et al. |

(Continued)

FOREIGN PATENT DOCUMENTS

| CN | 1942032 A | 4/2004 |
| CN | 102548078 A | 7/2012 |

(Continued)

OTHER PUBLICATIONS

European Search Report corresponding to application 20901678.1, dated Nov. 7, 2023, 8 pages.

(Continued)

*Primary Examiner* — Anthony Ho
(74) *Attorney, Agent, or Firm* — Reising Ethington P.C.

(57) ABSTRACT

An organic electroluminescent device includes, from bottom to top, a substrate, a first electrode and a light-emitting component in sequence, where the light-emitting component is disposed on the first electrode, and a secondary electrode structure is disposed on an upper side surface of the light-emitting component and includes a sub-electrode, a dielectric material layer and an outer layer electrode, where the dielectric material layer is disposed between the sub-electrode and the outer layer electrode, the sub-electrode is in contact with the light-emitting component, the dielectric material layer and the sub-electrode completely cover a light-emitting region of the light-emitting component, the (Continued)

outer layer electrode completely covers the dielectric material layer, and in a non-light-emitting region on the periphery of the light-emitting component, the outer layer electrode is electrically connected to the sub-electrode.

19 Claims, 4 Drawing Sheets

(51) Int. Cl.
*H10K 50/824* (2023.01)
*H10K 102/10* (2023.01)

(56) References Cited

U.S. PATENT DOCUMENTS

| | | |
|---|---|---|
| 2018/0076269 A1 | 3/2018 | Naganuma |
| 2018/0242425 A1 | 8/2018 | Hente |

FOREIGN PATENT DOCUMENTS

| | | |
|---|---|---|
| CN | 103066214 A | 4/2013 |
| CN | 106992267 A | 7/2017 |
| CN | 107925005 A | 4/2018 |
| CN | 111009618 A | 4/2020 |
| WO | 2012176276 A1 | 12/2012 |
| WO | 2017021372 A1 | 2/2017 |

OTHER PUBLICATIONS

Chinese Search Report corresponding to Chinese application 2020115044674; 2 pages.
International Search Report corresponding to PCT/CN2020/137407; dated Mar. 16, 2021; 4 pages.
Chinese Office Action corresponding to Chinese application 202011504467.1, 15 pages.

ORGANIC ELECTROLUMINESCENT DEVICE

CROSS-REFERENCE TO RELATED APPLICATION

This is a National stage application, filed under 37 U.S.C. 371, of International Patent Application NO. PCT/CN2020/137407, filed on Dec. 17, 2020, which is based on and claims priority to Chinese Patent Application No. 201911313157.9 filed with the China National Intellectual Property Administration (CNIPA) on Dec. 18, 2019, the disclosure of which is incorporated herein by reference in its entirety.

TECHNICAL FIELD

The present disclosure relates to the field of lighting technology of organic semiconductors and, in particular, to an organic electroluminescent device.

BACKGROUND

Defect points such as dust particles, burrs, pinholes and cracks inevitably appear in an organic light-emitting diode (OLED) screen in the manufacturing process, and a distance between an anode and a cathode of the OLED screen is generally very small (about tens to hundreds of nanometers). As a result, in this state, the anode and the cathode may be in direct contact, resulting in a defect point (referred to as a short circuit point), or an organic layer between the anode and the cathode may become thinner than the organic layer at other positions. When an OLED device is in operation, a current tends to flow through the defect point rather than other positions so that heat accumulates at the defect point, resulting in damages to the quality and reliability of the entire OLED device.

In the case where other conditions are the same, the larger the light-emitting area of the OLED screen is, the more likely the short circuit point appears. It is possible to reduce the short circuit point by increasing a thickness of the organic layer, which requires the OLED device to use a higher drive voltage, affecting device efficiency. Moreover, the short circuit point cannot be completely eliminated. It is possible to solve the problem of the short circuit point by adding a short circuit prevention/protection portion. In Chinese patent documents CN 110061036, CN 106133939 and CN 106463644, a short circuit prevention portion formed by use of a structure or a material can effectively improve the reliability of a device.

A design of a first short circuit prevention portion in the Chinese patent document CN 106463644 is mainly to generate certain impedance by a material or a geometric structure used in the short circuit prevention portion, where the theoretical formula is as follows:

$$I_s = I_t \times \frac{(R_{cell-org} + R_{cell-spl})}{(R_{cell-org} + R_{cell-spl}) + (n_{cell} - 1) \times (R_{cell-s} + R_{cell-spl})}.$$

When the defect appears, the short circuit prevention impedance can avoid a short circuit (this is because a resistance is connected in series in the device where the short circuit occurs). Therefore, two important factors are to be considered for such a short circuit prevention system: (1) a screen has sufficient pixels (that is, $n_{cell}$); (2) the short circuit prevention resistance is as large as possible (that is, $R_{cell-spl}$). If the above two necessary conditions cannot be achieved, an effect of preventing the short circuit is not significant, and high heat is generated at the short circuit point due to a large current ($P=I^2R$, where P=power, I=current, and R=resistance), thereby reducing the reliability. The experiment indicated that the above short circuit prevention system is suitable for a power supply which supplies a "constant voltage", that is, the current may vary within a very large interval. However, most power supply devices are unable to supply the "constant voltage", and OLED lighting screen bodies mainly use a power supply which provides a "constant current". Therefore, the above short circuit protection mechanism reduces the photovoltaic performance of the screen due to a large failure current (that is, a current flowing through the short circuit point (a normal current effectively supplied to an OLED device+the failure current at the short circuit point=a total current output by a constant power supply)) caused by the short circuit point. If a circuit protection device has a resistance large enough to match an equivalent resistance of a light-emitting pixel, the design of circuit protection in the form of a resistance connected in series can be achieved. However, through calculation, a value of the equivalent resistance of the light-emitting pixel is generally at a level of tens of thousands to hundreds of thousands of ohms, and the resistance of the circuit protection device is generally far less than this order of magnitude. Therefore, a very high proportion of a short circuit current flows through the short circuit point, resulting in a significant change of the overall optical performance of the screen.

In order to avoid the above case, the patent document CN 103348477 provides a design of a short circuit allowing device having a fuse. The design indicates that a short circuit or an abnormality occurs in each pixel, that is, the fuse is disconnected because a current through the fuse is 110% to 200% of an original current, so as to achieve an effective short circuit allowing function. The design patent has a theoretical defect.

The above patents have improved the reliability of the screen. However, several technical problems still need to be solved, which are described below.

(1) A light-emitting region needs to be pixelated, which causes a reduced effective light-emitting area, a separation line in appearance and a shortened device lifetime. Moreover, a minimum unit of a failure area is basically a size of the pixel, which causes significantly poor visual perception.

(2) A key premise for the validity of the above patent documents is that an input current is significantly greater than a threshold condition of the short circuit protection mechanism, for example, for the current through the short circuit point to be lower than a certain proportion of the total current or for the connected fuse to be disconnected, a large enough input current is required to start the short circuit protection mechanism. Therefore, the aforementioned technology cannot meet different lighting requirements, and more reliable technology is required for product applications.

(3) In the above patent documents, if the short circuit occurs at a grid or at a position on an edge of a non-light-emitting region where an electrode exists, the above short circuit protection mechanism will not work.

SUMMARY

In order to meet various different lighting requirements in the existing art, achieve a design that does not require pixelation and does not need to consider whether an input current can start a short circuit protection mechanism, improve design disadvantages, usage limitations and appearance disadvantages caused in the existing art and achieve a high-stability lighting screen with an integrated light-emitting region, the present disclosure provides an organic electroluminescent device.

The present disclosure uses technical solutions described below.

In an embodiment, an organic electroluminescent device includes, from bottom to top, a substrate, a light-emitting component and a second electrode in sequence, where the light-emitting component and the second electrode are disposed on the substrate, and a first secondary electrode structure is disposed between the substrate and the light-emitting component and includes a first sub-electrode and a first dielectric material layer, where an entire light-emitting region of the light-emitting component is completely in contact with an upper side surface of the first sub-electrode, a lower side surface of the first dielectric material layer is in contact with an upper side surface of the substrate, and an entire lower side surface of the first sub-electrode is completely in contact with an upper side surface of the first dielectric material layer.

An area of the entire light-emitting region of the light-emitting component is less than or equal to an area of the upper side surface of the first sub-electrode, and an area of a contact region between the first sub-electrode and the first dielectric material layer is less than or equal to an area of the upper side surface of the first dielectric material layer.

The first secondary electrode structure further includes a first outer layer electrode, where in a non-light-emitting region on the periphery of the light-emitting component, the first outer layer electrode is electrically connected to the first sub-electrode.

In an embodiment, an organic electroluminescent device includes, from bottom to top, a substrate, a first electrode and a light-emitting component in sequence, where the light-emitting component is disposed on the first electrode, and a second secondary electrode structure is disposed on an upper side surface of the light-emitting component and includes a second sub-electrode, a second dielectric material layer and a second outer layer electrode, where the second dielectric material layer is disposed between the second sub-electrode and the second outer layer electrode, the second sub-electrode is in contact with the light-emitting component, the second dielectric material layer and the second sub-electrode completely cover a light-emitting region of the light-emitting component, the second outer layer electrode completely covers the second dielectric material layer, and in a non-light emitting region on the periphery of the light-emitting component, the second outer layer electrode is electrically connected to the second sub-electrode.

A coverage area of the second dielectric material layer is greater than an area of the light-emitting region of the light-emitting component, and the second dielectric material layer is located within a coverage region of the second sub-electrode on the light-emitting component.

In an overlapping region of the first electrode and the second sub-electrode, a coverage region of the second dielectric material layer is greater than a coverage region of the first electrode.

The second dielectric material layer is further disposed between the first electrode and the substrate and completely covers a lower side surface of the first electrode.

A glass transition temperature Tg of each of the first dielectric material layer and the second dielectric material layer is lower than 500° C.

An auxiliary electrode layer is disposed on a side of the second sub-electrode facing away from the light-emitting component, where a thickness of the auxiliary electrode layer is greater than a thickness of the second sub-electrode.

The auxiliary electrode layer is a grid-shaped auxiliary electrode superimposed on the second sub-electrode.

The first sub-electrode and the second sub-electrode each are a metal conductor having a thickness of 1-150 nm or a metal oxide conductor having a thickness of 1-150 nm.

Each of the first sub-electrode and the second sub-electrode has a thickness of 5-50 nm, and an outer layer electrode is a reflective outer layer electrode having a thickness of 70-500 nm.

The first dielectric material layer and the second dielectric material layer each are an organic semiconductor or an organic insulator, and the first sub-electrode and the second sub-electrode each are one of Al, Ag, Mg, Au, indium tin oxide (ITO) and aluminum-doped zinc oxide

BRIEF DESCRIPTION OF DRAWINGS

To illustrate implementations of the present disclosure more clearly, the accompanying drawings used in the implementations will be briefly described below. Apparently, the accompanying drawings described below illustrate part of implementations of the present disclosure, and those of ordinary skill in the art may obtain other accompanying drawings based on the accompanying drawings described below on the premise that no creative work is done.

Figure 1:
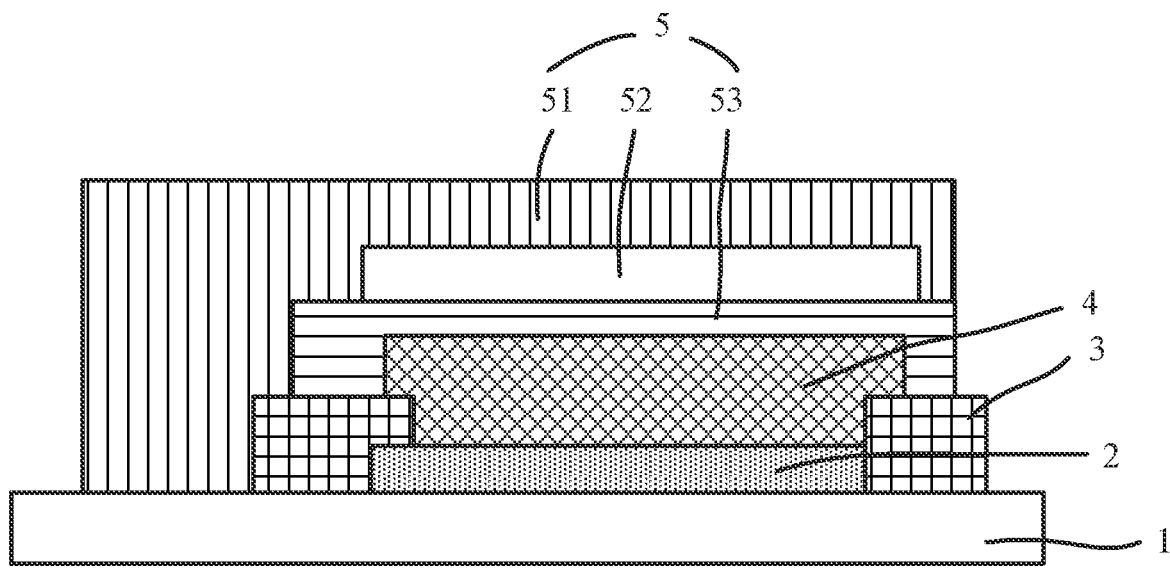
FIG. 1 is a structure diagram of a first electronic device (a structure diagram of a device in a non-lead region of a screen) according to the present disclosure.

REFERENCE LIST 1 substrate
2 first electrode
3 insulating layer
4 light-emitting component
5 second secondary electrode structure
51 second outer layer electrode 52 second dielectric material layer
53 second sub-electrode
6 auxiliary electrode layer
7 second electrode
8 first secondary electrode structure
81 first outer layer electrode
82 first dielectric material layer
83 first sub-electrode

DETAILED DESCRIPTION

Hereinafter, technical solutions of the present disclosure will be described clearly and completely in conjunction with drawings. Apparently, the embodiments described below are part, not all, of embodiments of the present disclosure. Based on the embodiments of the present disclosure, all other embodiments obtained by those skilled in the art without creative work are within the scope of the present disclosure.

In the description of the present disclosure, it is to be noted that orientations or position relations indicated by terms such as "center", "upper", "lower", "left", "right", "vertical", "horizontal", "in" and "out" are based on the drawings. These orientations or position relations are intended only to facilitate and simplify the description of the present disclosure and not to indicate or imply that a device or element referred to must have such particular orientations or must be configured or operated in such particular orientations. Thus, these orientations or position relations are not to be construed as limiting the present disclosure. Moreover, terms such as "first", "second" and "third" are used only for the purpose of description and are not to be construed as indicating or implying relative importance.

In the description of the present disclosure, it is to be noted that terms "mounted", "joined" or "connected" are to be understood in a broad sense unless otherwise expressly specified and limited. For example, the term "connected" may refer to "securely connected", "detachably connected" or "integrally connected", may refer to "mechanically connected" or "electrically connected" or may refer to "connected directly", "connected indirectly through an intermediary" or "connected inside two components". For those of ordinary skill in the art, specific meanings of the preceding terms in the present disclosure may be understood based on specific situations.

Embodiment One

Figure 2:
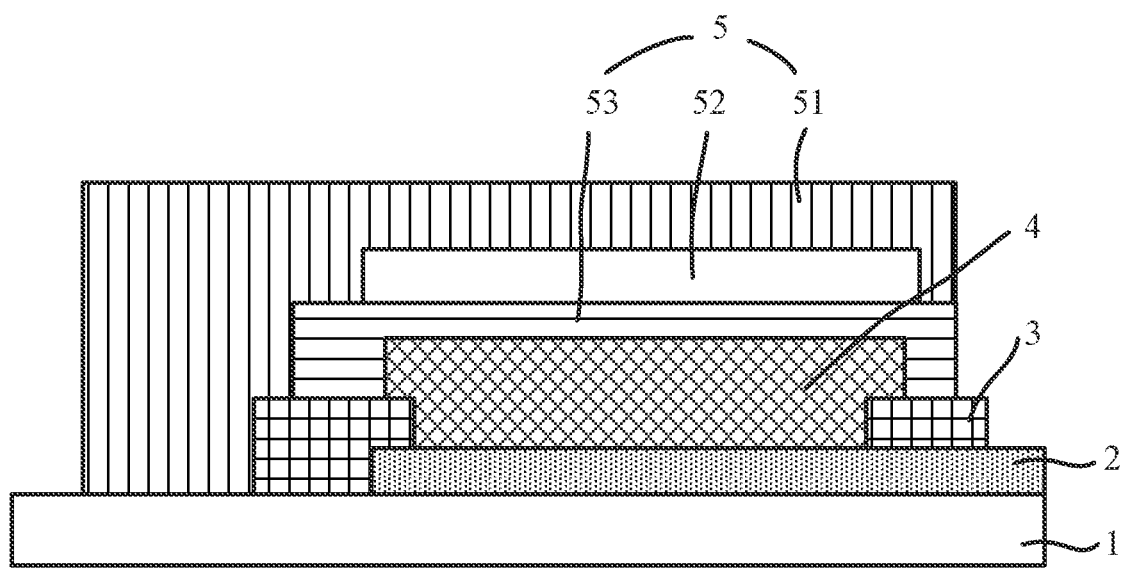
FIG. 2 is a structure diagram of a first electronic device (a structure diagram of a device in a lead region of a screen) according to the present disclosure.

The present disclosure provides an organic electroluminescent device. The organic electroluminescent device includes, from bottom to top, a substrate 1, a first electrode 2 and a light-emitting component 4 in sequence. The light-emitting component 4 includes a light-emitting layer and an electron transport layer and a hole transport layer which are disposed on two sides of the light-emitting layer respectively. A second secondary electrode structure 5 is further disposed on an upper side surface of the light-emitting component 4 and includes a second sub-electrode 53, a second dielectric material layer 52 and a second outer layer electrode 51. As shown in FIGS. 1 and 2, the second sub-electrode covers the electron transport layer (not shown in FIGS. 1 and 2) of the light-emitting component, and the second dielectric material layer and the second outer layer electrode are sequentially disposed on the second sub-electrode. In FIG. 1, a coverage area of the second dielectric material layer 52 is greater than an area of a light-emitting region of the light-emitting component and extends to a non-light-emitting region of the light-emitting component 4. The second sub-electrode and the second outer layer electrode completely wrap the second dielectric material layer. The hole transport layer, the first electrode and the substrate are sequentially disposed under the light-emitting layer. In the non-light-emitting region on the periphery of the light-emitting component, the second outer layer electrode is electrically connected to the second sub-electrode, and each of the second outer layer electrode and the second sub-electrode overlaps an insulating layer 3.

In the present embodiment, the second outer layer electrode covers an outer side surface of the second dielectric material layer. When the matched second outer layer electrode is a second reflective outer layer electrode, light irradiated onto the second outer layer electrode is partially reflected to the light-emitting layer, thereby compensating for light from the light-emitting region of the light-emitting component and improving luminescence efficiency of the light-emitting component. Moreover, in the non-light-emitting region of the light-emitting component, the second outer layer electrode and the second sub-electrode are connected together, which improves the conductivity of the second sub-electrode and is conducive to improving light emission uniformity of the light-emitting component.

In the present disclosure, the second dielectric material layer may be selected from an organic semiconductor or an organic insulator, such as polyimide (PI). In the present disclosure, a screen preferably uses an entire screen structure that is not pixilated, that is, a grid-free screen is used. The second sub-electrode is a metal conductor having a thickness of 1-150 nm or a metal oxide conductor having a thickness of 1-150 nm. A commonly used conductor may be used, such as Al, Ag, Mg, Au, ITO or AZO. The thinner the second sub-electrode in the second secondary electrode structure, the easier the second sub-electrode is to burn out. The thickness of the second sub-electrode is optimized, which can improve the reliability of the device and reduce a risk of a short circuit of the first electrode. The data is shown in the table below.

| Thickness of Second Sub-electrode (nm) | Brightness Uniformity of Screen | Current Efficiency (cd/A) | Number of Experimental Screens | Number of Screens Failing due to Short Circuit after the Experimental Screens Are Lighted for a Period of Time |
|---|---|---|---|---|
| 2 | 60% | 12 | 30 | 0 |
| 5 | 70% | 15 | 30 | 0 |
| 20 | 76% | 16 | 30 | 0 |
| 100 | 80% | 18 | 30 | 2 |
| 150 | 85% | 19 | 30 | 10 |
| 200 | 90% | 20 | 30 | 15 |

As shown in the above table, comprehensively considering effects of the thickness of the second sub-electrode on the device efficiency and the brightness uniformity of the screen, the present disclosure preferably uses the second sub-electrode having a thickness of 5-100 nm, and the device has optimal performance in all aspects.

In the present embodiment, the second sub-electrode uses a translucent Al thin film having a thickness of 5 nm, the second dielectric material layer uses polyimide having a thickness of 20 nm, and the second outer layer electrode has a thickness of 70 nm and uses the material Ag. The structure is compared with a conventional grid-free screen through an experiment, and the obtained data is shown in the table below.

| Screen Structure | Number of Experimental Screens | Number of Screens Failing due to Short Circuit after the Experimental Screens Are Lighted for a Period of Time | Yield |
| --- | --- | --- | --- |
| conventional grid-free screen | 20 | 15 | 25% |
| structure in Embodiment one | 20 | 0 | 100% |

As can be seen from the above table, the structure in the present embodiment can significantly improve the stability of the screen, and the yield is increased by 4 times.

When high heat is generated in the light-emitting component due to a short circuit, since the second sub-electrode is relatively thin, the corresponding position of the second sub-electrode is burnt out due to local high heat at a short circuit point, and the position burnt out is filled with the second dielectric material layer in time, so that the short circuit rapidly becomes an open circuit and other parts of the light-emitting component keep emitting light normally.

Since the coverage range of the second dielectric material layer extends to the non-light-emitting region, if the short circuit occurs at a position on an edge of the non-light-emitting region where an electrode exists, the second sub-electrode and the second dielectric material layer also provide short circuit protection for the non-light-emitting region.

Dust and particles cannot be completely avoided in the manufacturing process. When the conventional grid-free screen is in operation, the short circuit point gradually appears. After the short circuit occurs, most of the current flows to the short circuit point so that other parts of the screen have significantly reduced brightness or are not bright. Moreover, too large a current flowing through the short circuited part causes an organic material to be burnt out. For the screen with the structure in Embodiment one, after the short circuit occurs, the second sub-electrode is burnt out instantly due to too large a current, and the position burnt out is filled with a dielectric material so that the short circuit becomes the open circuit. A black dot invisible to naked eyes appears on the screen, but the screen can operate normally. As can be seen from the data in the above table, the screen with the structure in Embodiment one of present disclosure can effectively prevent the screen from failing due to the short circuit compared with the conventional grid-free screen.

In the solution of the present disclosure, the screen does not need to be pixelated, and the entire grid-free screen is used, thereby reducing the use of an insulating layer material, simplifying the manufacturing process, and saving a cost.

Embodiment Two

Figure 3:
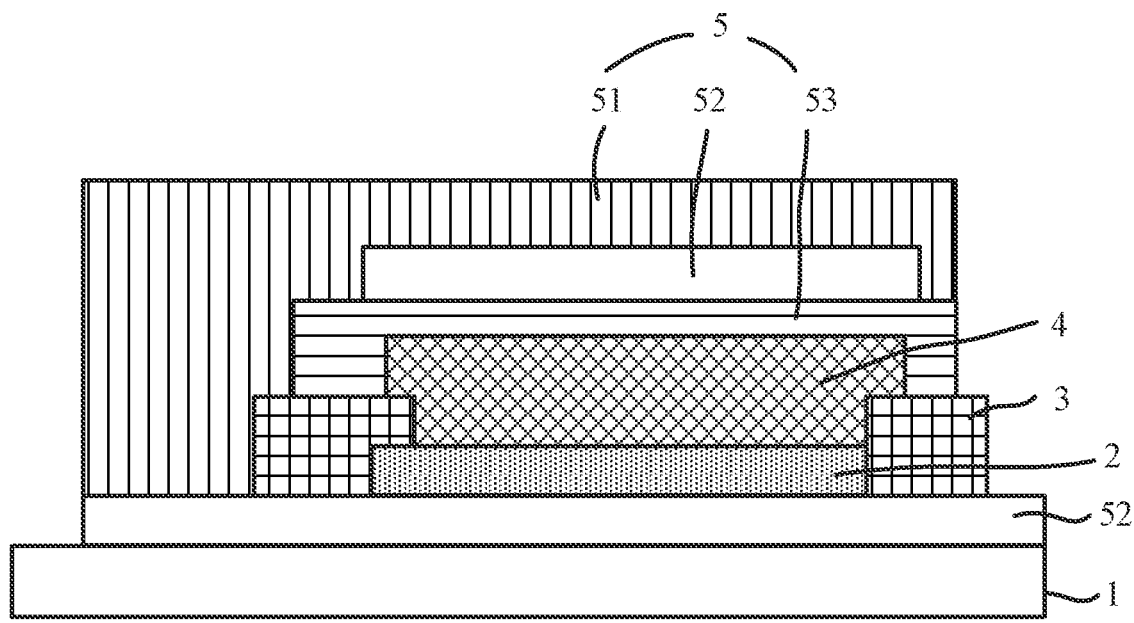
FIG. 3 is a structure diagram of a second electronic device (a structure diagram of a device in a non-lead region of a screen) according to the present disclosure.
Figure 4:
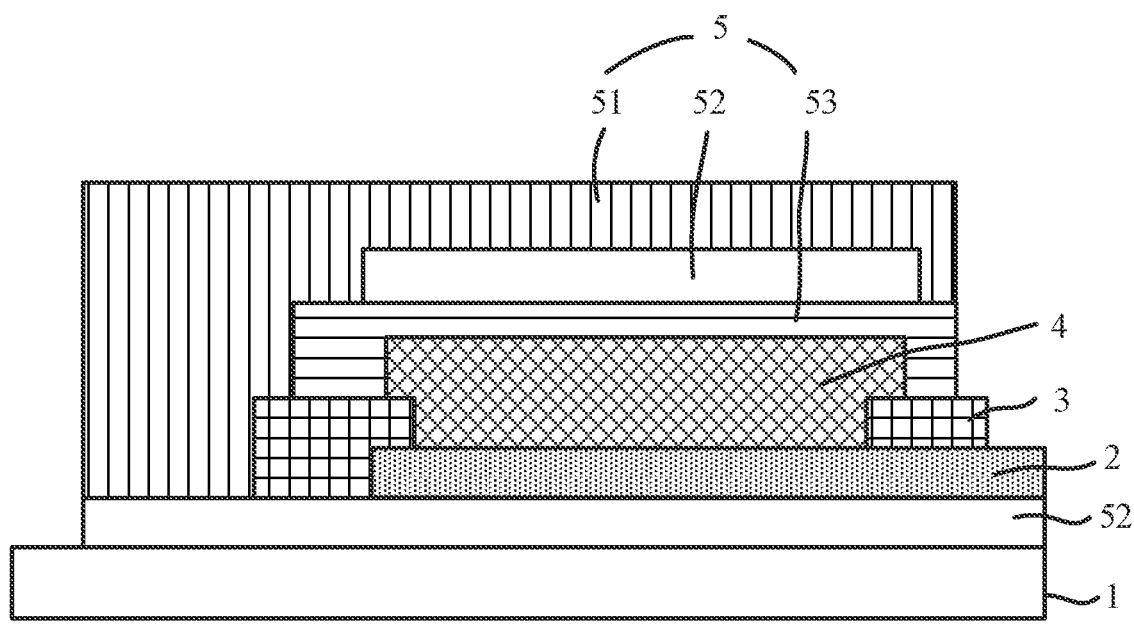
FIG. 4 is a structure diagram of a second electronic device (a structure diagram of a device in a lead region of a screen) according to the present disclosure.

As shown in FIGS. 3 and 4, in the present embodiment, the second secondary electrode structure is disposed on the light-emitting component, that is, the electron transport layer (not shown in FIGS. 3 and 4), the second sub-electrode, the second dielectric material layer and the second outer layer electrode sequentially cover the light-emitting layer, and the hole transport layer (not shown in FIGS. 3 and 4), the first electrode, the second dielectric material layer and the substrate are sequentially disposed under the light-emitting layer. The second dielectric material layers completely cover entire light-emitting regions on two sides of the light-emitting layer, and the coverage area of the second dielectric material layer is greater than an area of the first electrode, that is, the second dielectric material layer completely covers the entire first electrode (except a lead region).

On the basis of Embodiment one, the second dielectric material layer is added between the first electrode and the substrate in the present embodiment. Here, the first electrode and the second sub-electrode are made of the same material, and relatively thin material layers may be selected.

Similarly, when the short circuit occurs, a high temperature at the short circuit point causes the corresponding position of the first electrode or the second sub-electrode to be burnt out, and the position burnt out is filled with the second dielectric material layers on two sides in time, thereby avoiding that the entire light-emitting component cannot operate normally due to a local short circuit and providing more sufficient double protection for the light-emitting component.

In the present embodiment, the second sub-electrode uses a material ITO having a thickness of 100 nm. The structure is compared with a conventional grid-free screen through an experiment, and the yield is significantly improved. The obtained data is shown in the table below.

| Screen Structure | Number of Experimental Screens | Number of Screens Failing due to Short Circuit after the Experimental Screens Are Lighted for a Period of Time | Yield |
| --- | --- | --- | --- |
| conventional grid-free screen | 30 | 20 | 33% |
| structure in Embodiment two | 30 | 0 | 100% |

As can be seen from the above table, the structure in the present embodiment can significantly improve the yield of the screen.

Embodiment Three

On the basis of Embodiment two, when the matched second outer layer electrode is a second reflective outer layer electrode, the adjustment of an optical resonant cavity can be achieved in the second outer layer electrode having a reflectance of 90% to adjust the light emission characteristics of the entire light-emitting component.

A distance between the light-emitting layer and the second reflective outer layer electrode is calculated according to a wavelength of the light-emitting layer:

$$d = k\lambda/4n, \text{ where } k=1,3,5,\ldots$$

where $\lambda$ denotes an emission wavelength, n denotes a refractive index, and d denotes the distance between the light-emitting layer and the electrode.

When the distance conforms to the above formula, the device efficiency is improved.

| Screen Structure | Current Efficiency (cd/A) |
| --- | --- |
| conventional grid-free screen | 15 |
| Embodiment three | 20 |

As can be seen from the above table, compared with the conventional grid-free screen, the structure in which the second outer layer electrode having a reflective function is added can significantly improve the device efficiency.

Embodiment Four

In the present embodiment, the second sub-electrode on the electron transport layer uses an Al thin film having a thickness of 10 nm, the second outer layer electrode has a thickness of 500 nm, and the first electrode under the hole transport layer uses a Ag thin film having a thickness of 20 nm. As a result, deep blue light or ultraviolet light can be effectively absorbed, reducing the damage of light within a high-energy wave band to the light-emitting component.

| Screen Structure | Decrease in Brightness after Storage for the Same Time under Lamp Which Simulates Irradiation of Sun |
|---|---|
| conventional grid-free structure | 85% |
| Embodiment four | 92% |

The cracking of the organic material is accelerated under the irradiation of high-energy light in sunlight so that the decrease in performance of the OLED screen is accelerated and the lifetime of the OLED screen is shortened. The structure in Embodiment four of the present disclosure can absorb part of ultraviolet and near-ultraviolet light, reduce an effect of the irradiation of sunlight on the lifetime of the OLED, and delay the decrease in brightness.

Embodiment Five

Figure 5:
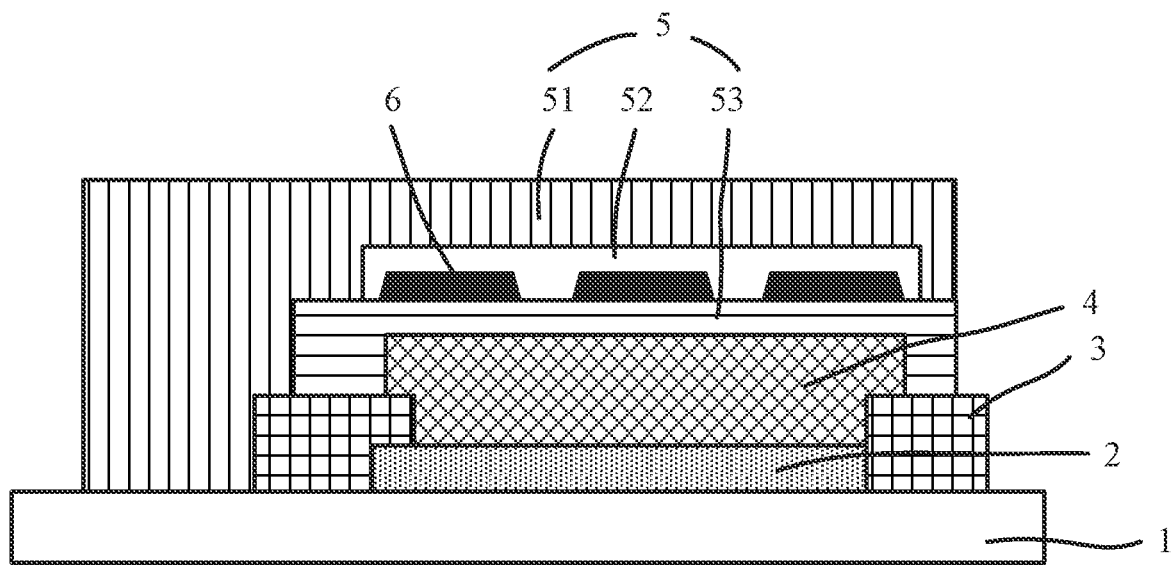
FIG. 5 is a structure diagram of a third electronic device according to the present disclosure.

As shown in FIG. 5, on the basis of Embodiment one, in the present embodiment, a grid-shaped auxiliary electrode layer is further provided on an upper side surface of the second sub-electrode. The structure of a lead region of the grid-shaped auxiliary electrode layer is the same as that shown in FIG. 2 in Embodiment one and is not repeated here. The auxiliary electrode layer can improve the conductivity of the second sub-electrode to a certain extent, which is conducive to improving the light emission uniformity of the light-emitting component.

Figure 6:
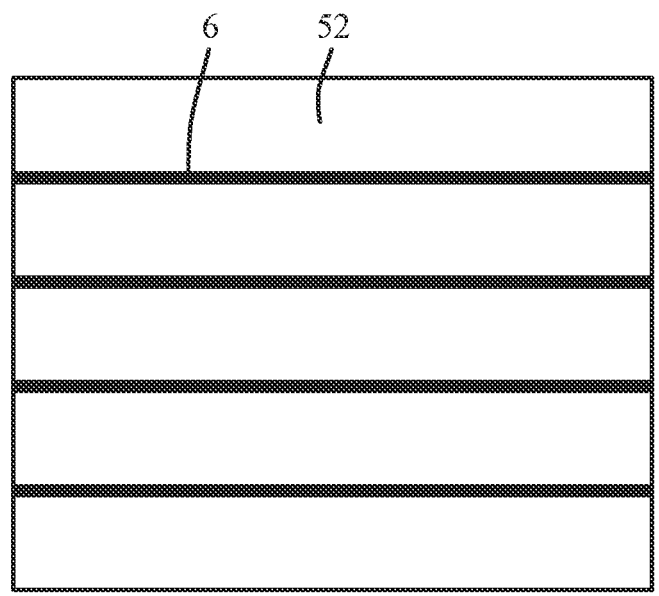
FIG. 6 is a diagram showing a first distribution of an auxiliary electrode on a second sub-electrode according to the present disclosure.
Figure 7:
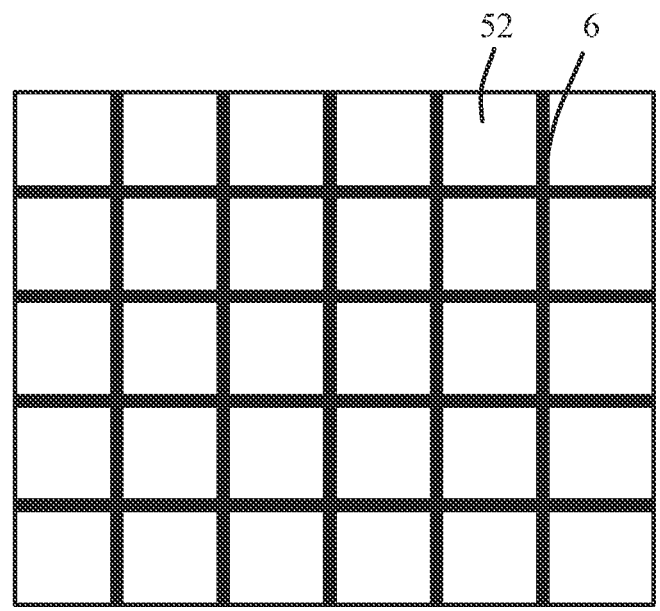
FIG. 7 is a diagram showing a second distribution of an auxiliary electrode on a second sub-electrode according to the present disclosure.

The used grid-shaped auxiliary electrode layer has a thickness of 100-1000 nm, preferably 500 nm and is preferably made of the same material as the second sub-electrode. The thickness of the auxiliary electrode layer is greater than a thickness of the second sub-electrode. As shown in FIGS. 6 and 7, the auxiliary electrode layer disposed on the second sub-electrode may be in rows or may be in a shape of a grid formed through horizontal and vertical intersection.

The two structures shown in FIGS. 1 and 5 are compared. As shown in the table below, the auxiliary electrode layer is disposed so that the brightness uniformity of the screen is significantly improved.

| Screen Structure | Brightness Uniformity of Screen |
|---|---|
| Embodiment one | 80% |
| Embodiment five | 90% |

In the preceding embodiments, the second outer layer electrode has a thickness of 70-500 nm and is made of a metal material. The thickened second outer layer electrode can effectively improve conductivity. In all or part of the non-light-emitting region on the periphery of the light-emitting region, the second outer layer electrode is electrically connected to the second sub-electrode, thereby effectively improving the light emission uniformity of the screen of the light-emitting component.

Embodiment Six

The structure in FIG. 1 is used. The second sub-electrode uses an Ag thin film having a thickness of 15 nm, the second dielectric material layer has a glass transition temperature Tg of 200° C., and the second outer layer electrode has a thickness of 300 nm and uses a material Al.

Comparative Embodiment Six

The structure in FIG. 1 is used. The second sub-electrode uses an Ag thin film having a thickness of 15 nm, the second dielectric material layer has a glass transition temperature Tg of 700° C., and the second outer layer electrode has a thickness of 300 nm and uses a material Al.

Embodiment Seven

The structure in FIG. 3 is used. The second sub-electrode uses an Ag thin film having a thickness of 15 nm, the second dielectric material layer has a glass transition temperature Tg of 200° C., and the second outer layer electrode has a thickness of 300 nm and uses a material Al.

Comparative Embodiment Seven

The structure in FIG. 3 is used. The second sub-electrode uses an Ag thin film having a thickness of 15 nm, the second dielectric material layer has a glass transition temperature Tg of 700° C., and the second outer layer electrode has a thickness of 300 nm and uses a material Al.

| No. | Efficiency (cd/A) | Brightness Uniformity of Screen | Defect Rate due to Short Circuit Failure after Screen Is Lighted for a Period of Time |
|---|---|---|---|
| Embodiment six | 15 | 75% | 1% |
| Comparative Embodiment six | 15 | 76% | 6% |
| Embodiment seven | 16 | 75% | 0% |
| Comparative Embodiment seven | 16 | 76% | 4% |

As can be seen from the experimental results of Embodiments six and seven and Comparative Embodiments six and seven, when the second dielectric material layer has a relatively small Tg, the screen has a lower defect rate and a better effect of preventing the short circuit.

In the present disclosure, a dielectric material layer having a glass transition temperature Tg of lower than 500° C. is used. When a short circuit occurs, if the second sub-electrode cannot be fused in time, the temperature rises so that the second dielectric material layer is vaporized and the sub-electrode at a short circuit point is separated from the sub-electrode at other positions to form an open circuit, further improving the effect of preventing the device from the short circuit.

Preferably, the glass transition temperature Tg of the second dielectric material layer used in the preceding embodiments may also have other values within a range of lower than 500° C., which is not repeated here.

Embodiment Eight

Figure 8:
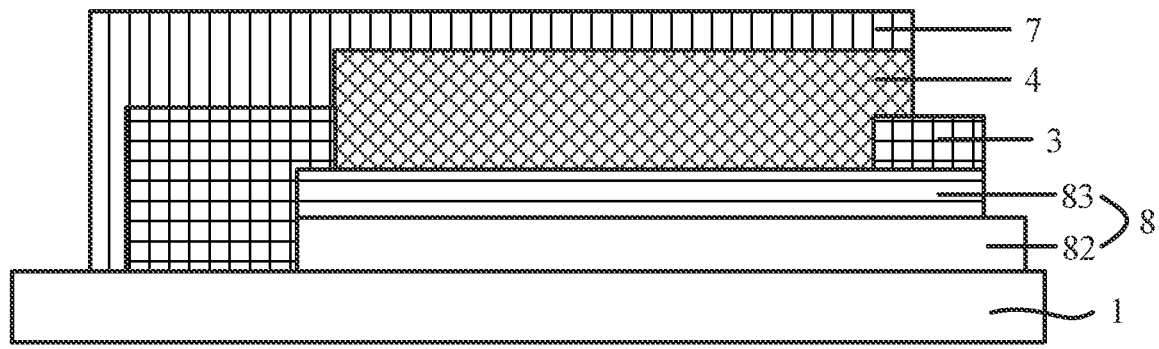
FIG. 8 is a structure diagram of a fourth electronic device (containing no first outer layer electrode) according to the present disclosure.

As shown in FIG. 8, the present disclosure provides an organic electroluminescent device. The organic electroluminescent device includes, from bottom to top, a substrate 1, a light-emitting component 4 and a second electrode 7 in sequence. The light-emitting component 4 and the second electrode 7 are disposed on the substrate 1. The light-emitting component 4 includes a light-emitting layer and an electron transport layer and a hole transport layer which are disposed on two sides of the light-emitting layer. A first secondary electrode structure 8 is disposed between the substrate 1 and the light-emitting component 4. The first secondary electrode structure 8 includes a first sub-electrode 83 and a first dielectric material layer 82. An entire light-emitting region on a lower side surface of the light-emitting component 4 is completely in contact with an upper side surface of the first sub-electrode 83. Further, an area of the entire light-emitting region of the light-emitting component 4 is preferably less than or equal to an area of the upper side surface of the first sub-electrode 83. A lower side surface of the first dielectric material layer 82 is in contact with an upper side surface of the substrate 1, and an entire lower side surface of the first sub-electrode 83 is completely in contact with an upper side surface of the first dielectric material layer 82. Further, an area of a contact region between the first sub-electrode 83 and the first dielectric material layer 82 is preferably less than or equal to an area of the upper side surface of the first dielectric material layer 82. The upper side surface of the first sub-electrode 83 is in contact with the hole transport layer (not shown in FIG. 8) of the light-emitting component 4, and the second electrode 7 covers the electron transport layer (not shown in FIG. 8).

The first secondary electrode structure 8 is disposed on a side where a light emission surface is located. The first sub-electrode in the first secondary electrode structure 8 is in contact with the light-emitting component. A material of the first sub-electrode is a metal conductor or a metal oxide conductor having a thickness of 1-150 nm, preferably 5-50 nm. For example, the material of the first sub-electrode may be one of metal conductors such as Al, Ag, Mg and Au and preferably has a thickness of 1-50 nm. The material of the first sub-electrode may also be one of metal oxide conductors such as ITO and AZO and preferably has a thickness of 5-150 nm. The second electrode 7 is a reflective opaque electrode having a thickness of 10-10000 nm and may use Al, Ag, Mg, Au or the like. The first dielectric material layer has a glass transition temperature Tg of lower than 500° C. Further, the first dielectric material layer preferably uses an organic semiconductor material or an organic insulator material, which includes an organic small molecule material and specifically includes one of N,N'-bis-phenyl-N,N'-(1-naphthalenyl)-1,1'-biphenyl-4,4'-diamine (NPB), N,N'-di(1-naphthyl)-N,N'-diphenyl-(1,1'-biphenyl)-4,4'-diamine (NPD), 4,4',4''-tris(N-3-methylphenyl-N-phenylamino)triphenylamine (m-MTDATA), 4,4',4''-tris(carbazol-9-yl)-triphenylamine (TCTA) and Liq. In the present disclosure, the first sub-electrode and the first dielectric material layer are added, which does not affect the device efficiency and the uniformity of the screen. The first sub-electrode and the second electrode 7 are electrodes having relatively good reflectivity.

As shown in FIG. 8, in the present embodiment, the material of the first sub-electrode is the metal conductor Al having a thickness of 50 nm, the first dielectric material layer has a glass transition temperature Tg of 200° C., and the second electrode uses Al having a thickness of 3000 nm.

The light-emitting component in Embodiment eight is detected, and the parameter is shown below.

| No. | Brightness Uniformity of Screen |
|---|---|
| Embodiment eight | 80% |

Preferably, the material of the first sub-electrode used in the preceding embodiment is the metal conductor Al. In other embodiments, one of the metal conductors such as Ag, Mg and Au may also be used.

Preferably, the first sub-electrode in the preceding embodiment has a thickness of 50 nm. In other embodiments, other values within a thickness range of 1-50 nm may also be selected.

Embodiment Nine

Figure 9:
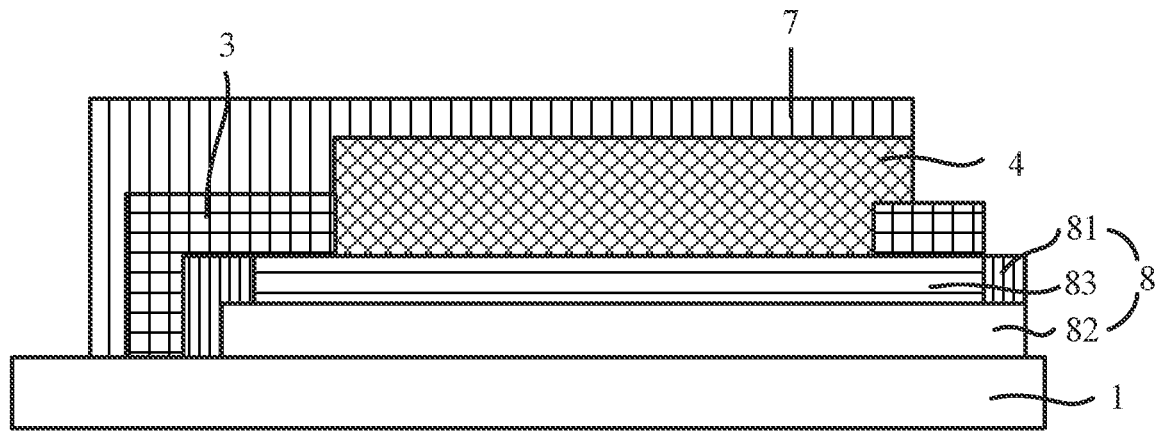
FIG. 9 is a structure diagram of a fifth electronic device (containing a first outer layer electrode) according to the present disclosure.

As shown in FIG. 9, on the basis of Embodiment eight, the first secondary electrode structure further includes a first outer layer electrode. Part of the first outer layer electrode and the first sub-electrode are disposed on the first dielectric material layer, and in a non-light-emitting region on the periphery of the light-emitting component, the first outer layer electrode is electrically connected to the first sub-electrode.

In the present embodiment, the first sub-electrode uses the metal conductor Al having a thickness of 50 nm, the first dielectric material layer has a glass transition temperature Tg of 200° C., and the second electrode uses Al having a thickness of 3000 nm.

| No. | Brightness Uniformity of Screen |
|---|---|
| Embodiment eight (containing an outer layer electrode) | 90% |

Through the comparison of Embodiment eight with Embodiment nine, the first outer layer electrode is added in Embodiment nine so that the brightness uniformity of the device can be improved.

Preferably, the glass transition temperature Tg of the first dielectric material layer used in the preceding embodiment is 200° C. In other embodiments, other values within a range of lower than 500° C. may also be selected.

Embodiment Ten

Embodiment ten differs from Embodiment nine in that the first sub-electrode in Embodiment ten uses the metal oxide conductor. Specifically, the material of the first sub-electrode is ITO having a thickness of 150 nm, the first dielectric material layer has a glass transition temperature Tg of 200° C., and the second electrode uses Al having a thickness of 3000 nm.

Comparative Embodiment Ten

On the basis of Embodiment ten, the first dielectric material layer has a glass transition temperature Tg of 600° C.

The detection results of Embodiment ten and Comparative Embodiment ten are shown in the table below.

| No. | Defect Rate due to Short Circuit Failure after Screen Is Lighted for a Period of Time |
|---|---|
| Embodiment ten | 1% |
| Comparative Embodiment ten | 5% |

Here, the first dielectric material layer preferably has a glass transition temperature Tg of lower than 500° C., and the material of the first dielectric material layer is preferably the organic semiconductor material or the organic insulator material. When the short circuit occurs, if a short circuit current is too small and the first sub-electrode cannot be fused in time, the temperature rises so that the first dielectric material layer is vaporized and the first sub-electrode at the short circuit point is separated from the first sub-electrode at other positions in time to form an open circuit. Therefore, the screen in Embodiment ten has a relatively low defect rate due to the short circuit failure compared with that in Comparative Embodiment ten.

The thickness of the first sub-electrode is further optimized on the basis of Embodiment ten. The table below shows the comparison of performance of electroluminescent devices using first sub-electrodes having different thicknesses.

| Thickness of First Sub-electrode (nm) | Brightness Uniformity of Screen | Current Efficiency (cd/A) | Defect Rate due to Short Circuit Failure after Screen Is Lighted for a Period of Time |
|---|---|---|---|
| 2 | 60% | 15 | 0% |
| 5 | 80% | 19 | 0% |
| 20 | 90% | 20 | 0% |
| 100 | 90% | 20 | 0% |
| 150 | 90% | 20 | 1% |

As can be seen from the above table, comprehensively considering the effects of the thickness of the first sub-electrode on the device efficiency and the brightness uniformity of the screen, the present disclosure preferably uses the first sub-electrode which is made of a metal oxide conductor material having a thickness of 5-150 nm, and the device has optimal performance in all aspects.

Preferably, the material of the first sub-electrode used in the preceding embodiment is the metal oxide conductor ITO. In other embodiments, the metal oxide conductor such as AZO may also be used.

Embodiment Eleven

In the present embodiment, on the basis of Embodiment ten, the first sub-electrode uses a thin layer of a metal Ag having a thickness of 15 nm, the first dielectric material layer has a glass transition temperature Tg of 200° C., and the second electrode uses Al having a thickness of 3000 nm.

Comparative Embodiment Eleven

The material of the first sub-electrode uses ITO having a thickness of 15 nm, the first dielectric material layer has a glass transition temperature Tg of 200° C., and the second electrode uses Al having a thickness of 3000 nm.

| No. | Current Efficiency of Screen (cd/A) | Brightness Uniformity of Screen | Defect Rate due to Short Circuit Failure after Screen Is Lighted for a Period of Time |
|---|---|---|---|
| Embodiment eleven | 20 | 90% | 0% |
| Comparative Embodiment eleven | 19 | 83% | 0% |

As can be seen from the above table, the first dielectric material layer used in Embodiment eleven has a Tg of lower than 500° C. When the short circuit occurs, if the first sub-electrode cannot be fused in time, the temperature rises so that the first dielectric material layer is vaporized and the first sub-electrode at the short circuit point is separated from the first sub-electrode at other positions to form an open circuit, further improving the effect of preventing the device from failing due to the short circuit. Moreover, compared with the first sub-electrode in Comparative Embodiment eleven, the first sub-electrode in Embodiment eleven uses Ag having relatively good reflectivity, thereby improving the efficiency and uniformity of the device to a certain extent.

The thickness of the first sub-electrode may be further optimized on the basis of Embodiment eleven. The performance of the devices using first sub-electrodes having different thicknesses is tested, and the obtained performance is shown below.

| Thickness of First Sub-electrode (nm) | Brightness Uniformity of Screen | Current Efficiency (cd/A) | Defect Rate due to Short Circuit Failure after Screen Is Lighted for a Period of Time |
|---|---|---|---|
| 2 | 70% | 16 | 0% |
| 5 | 83% | 19 | 0% |
| 10 | 90% | 20 | 0% |
| 20 | 90% | 21 | 0% |
| 50 | 90% | 22 | 1% |

As shown in the above table, comprehensively considering the effects of the thickness of the first sub-electrode on the device efficiency and the brightness uniformity of the screen, the present disclosure preferably uses the first sub-electrode which is made of the metal conductor material having a thickness of 5-50 nm, and the device has optimal performance in all aspects.

Embodiment Twelve

On the basis of Embodiment eleven, the first sub-electrode uses a thin layer of a metal Ag having a thickness of 15 nm, the first dielectric material layer has a glass transition temperature Tg of 200° C., and the second electrode uses Ag having a thickness of 3000 nm.

| No. | Current Efficiency of Screen (cd/A) | Brightness Uniformity of Screen | Defect Rate due to Short Circuit Failure after Screen Is Lighted for a Period of Time |
|---|---|---|---|
| Embodiment twelve | 30 | 90% | 0% |

In Embodiment twelve, both the first sub-electrode and the second electrode use the metal Ag which has a very good reflectance (98%). Therefore, compared with Embodiment eleven in which the second electrode uses the metal Al (having a reflectance of 95%), Embodiment twelve can significantly improve the efficiency of the device.

Embodiment Thirteen

On the basis of Embodiment one, a second dielectric material layer having a reflective function is used in the present embodiment, and a material having a reflectance of 85% or more is preferably used, for example, a treated polyimide thin film is used, which has a reflectance of up to 90%.

| Reflectance of Second Dielectric Material Layer | Current Efficiency (cd/A) |
|---|---|
| 70% | 16 |
| 90% | 18 |

As can be seen from the above table, the second dielectric material layer using the material having a reflectance of 70% and the second dielectric material layer using the material having a reflectance of 90% are compared in terms of device efficiency. The reflectance of the second dielectric material layer is increased so that the luminescence efficiency of the entire electroluminescent device can be significantly improved. Therefore, a dielectric material layer having a relatively high reflectance may be appropriately selected to improve the device efficiency.

The technical solutions of the present disclosure have advantages described below.

A. The electrode structure used in the present disclosure is disposed under and/or on the light-emitting component, adding the first sub-electrode and/or the second sub-electrode does not reduce the conductivity of the electrode in the original light-emitting component, the efficiency and brightness uniformity of the device are not affected, and the device has a simple structure. The efficiency and brightness uniformity of the screen are measured through experiments, which are slightly improved compared with those of an existing conventional electroluminescent device having no secondary electrode structure, thereby ensuring the performance of the device. Moreover, compared with the existing conventional electroluminescent device having no secondary electrode structure, the screen of the present disclosure has a significantly lower defect rate than the conventional device in terms of the defect rate due to a short circuit failure after the screen is lighted. The dielectric material layer having a glass transition temperature Tg of lower than 500° C. is preferably used. When the short circuit occurs, if the first sub-electrode and/or the second sub-electrode cannot be fused in time, the temperature rises so that the first dielectric material layer and/or the second dielectric material layer are vaporized and the sub-electrode at a short circuit point is separated from the sub-electrode at other positions to form an open circuit, further improving an effect of preventing the device from failing due to the short circuit.

B. In the present disclosure, the second secondary electrode structure is disposed on a side of the light-emitting component facing away from the substrate. The second dielectric material layer and the second sub-electrode in the second secondary electrode structure completely cover the light-emitting region of the light-emitting component. When the short circuit occurs in the light-emitting component, high heat is generated at the short circuit point. Since the second sub-electrode in the second secondary electrode structure is very thin, the second sub-electrode is burned out in a very short time, and a position of the second sub-electrode burned out is filled with the second dielectric material layer in time so that the short circuit becomes an open circuit, and the performance and normal use of the OLED device are not affected. The light-emitting component in the present disclosure does not need to be pixelated, and the present disclosure preferably uses an entire screen structure that is not pixelated, achieving a "grid-free" high-stability device and reducing the dependency on an insulating layer material.

C. In the present disclosure, the second outer layer electrode is disposed on an outer side surface of the second dielectric material layer. The thickness of the second outer layer electrode is greater than the thickness of the second sub-electrode, and in the non-light-emitting region of the light-emitting component, the second outer layer electrode is electrically connected to the second sub-electrode so that the conductivity of the second sub-electrode can be significantly improved, and the overall light emission uniformity of the electroluminescent device can be improved. When the second reflective outer layer electrode is used, light emission characteristics can be adjusted through the adjustment of an optical resonant cavity.

D. In the present disclosure, the second secondary electrode structure is disposed on the light-emitting component so that other additional functions can also be achieved. When the second sub-electrode uses a translucent metal thin film, deep blue light or ultraviolet light can be effectively absorbed, reducing the damage of light within a high-energy wave band to the electroluminescent device.

E. Since the second sub-electrode is relatively thin and has a relatively large resistance, in the present disclosure, the grid-shaped auxiliary electrode layer is further disposed on the second sub-electrode. The auxiliary electrode layer can improve the conductivity of the second sub-electrode to a certain extent, which is conductive to improving the light emission uniformity of the light-emitting component. Compared with a traditional screen structure, the auxiliary electrode layer with the grid-shaped structure can improve the brightness uniformity of the screen by 10%.

F. In the present disclosure, the second dielectric material layer is made of a material having a high reflectance. The second dielectric material layer having a high reflectance improves the efficiency of the screen using the relatively thin second sub-electrode to a certain extent.

G. In the present disclosure, the first dielectric material layer and the second dielectric material layer are made of an organic semiconductor material and an organic insulator material so that the first dielectric material layer and the second dielectric material layer each have a relatively low glass transition temperature and enhance the effect of preventing the device from the short circuit. Moreover, refractive indexes of the materials of the first dielectric material layer and the second dielectric material layer are similar to refractive indexes of the materials of the first sub-electrode, the second sub-electrode and the light-emitting component, thereby reducing light energy losses of the device and improving device performance.

Apparently, the preceding embodiments are merely examples for a clear description and not intended to limit the implementations. For those of ordinary skill in the art, changes or alterations in other different forms may also be made based on the preceding description. All implementations of the present disclosure cannot be and do not need to be exhausted herein. The apparent changes or alternations thus derived are still within the scope of the present disclosure.

What is claimed is:

1. An organic electroluminescent device, comprising, from bottom to top, a substrate, a first electrode and a light-emitting component in sequence, wherein the light-emitting component is disposed on the first electrode, and a second secondary electrode structure is disposed on an upper side surface of the light-emitting component and comprises a second sub-electrode, a second dielectric material layer and a second outer layer electrode, wherein the second dielectric material layer is disposed between the second sub-electrode and the second outer layer electrode, the second sub-electrode is in contact with the light-emitting component, the second dielectric material layer and the second sub-electrode completely cover a light-emitting region of the light-emitting component, the second outer layer electrode completely covers the second dielectric material layer, and in a non-light-emitting region on a periphery of the light-emitting component, the second outer layer electrode is electrically connected to the second sub-electrode;

wherein in an overlapping region of the first electrode and the second sub-electrode, a coverage region of the second dielectric material layer is greater than a coverage region of the first electrode.

2. The organic electroluminescent device according to claim 1, wherein a coverage area of the second dielectric material layer is greater than an area of the light-emitting region of the light-emitting component, and the second dielectric material layer is located within a coverage region of the second sub-electrode on the light-emitting component.

3. The organic electroluminescent device according to claim 1, wherein a glass transition temperature Tg of the second dielectric material layer is lower than 500° C.

4. The organic electroluminescent device according to claim 1, wherein the second sub-electrode is a metal conductor having a thickness of 1-150 nm or a metal oxide conductor having a thickness of 1-150 nm.

5. The organic electroluminescent device according to claim 4, wherein the second sub-electrode has a thickness of 5-50 nm, and an outer layer electrode is a reflective outer layer electrode having a thickness of 70-500 nm.

6. The organic electroluminescent device according to claim 5, wherein the second dielectric material layer is an organic semiconductor or an organic insulator, and the second sub-electrode is one of Al, Ag, Mg, Au, indium tin oxide (ITO) and aluminum-doped zinc oxide (AZO).

7. An organic electroluminescent device, comprising, from bottom to top, a substrate, a first electrode and a light-emitting component in sequence, wherein the light-emitting component is disposed on the first electrode, and a second secondary electrode structure is disposed on an upper side surface of the light-emitting component and comprises a second sub-electrode, a second dielectric material layer and a second outer layer electrode, wherein the second dielectric material layer is disposed between the second sub-electrode and the second outer layer electrode, the second sub-electrode is in contact with the light-emitting component, the second dielectric material layer and the second sub-electrode completely cover a light-emitting region of the light-emitting component, the second outer layer electrode completely covers the second dielectric material layer, and in a non-light-emitting region on a periphery of the light-emitting component, the second outer layer electrode is electrically connected to the second sub-electrode;

wherein the second dielectric material layer is further disposed between the first electrode and the substrate and completely covers a lower side surface of the first electrode.

8. The organic electroluminescent device according to claim 7, wherein a coverage area of the second dielectric material layer is greater than an area of the light-emitting region of the light-emitting component, and the second dielectric material layer is located within a coverage region of the second sub-electrode on the light-emitting component.

9. The organic electroluminescent device according to claim 7, wherein a glass transition temperature Tg of the second dielectric material layer is lower than 500° C.

10. The organic electroluminescent device according to claim 7, wherein the second sub-electrode is a metal conductor having a thickness of 1-150 nm or a metal oxide conductor having a thickness of 1-150 nm.

11. The organic electroluminescent device according to claim 10, wherein the second sub-electrode has a thickness of 5-50 nm, and an outer layer electrode is a reflective outer layer electrode having a thickness of 70-500 nm.

12. The organic electroluminescent device according to claim 11, wherein the second dielectric material layer is an organic semiconductor or an organic insulator, and the second sub-electrode each is one of Al, Ag, Mg, Au, indium tin oxide (ITO) and aluminum-doped zinc oxide (AZO).

13. An organic electroluminescent device, comprising, from bottom to top, a substrate, a first electrode and a light-emitting component in sequence, wherein the light-emitting component is disposed on the first electrode, and a second secondary electrode structure is disposed on an upper side surface of the light-emitting component and comprises a second sub-electrode, a second dielectric material layer and a second outer layer electrode, wherein the second dielectric material layer is disposed between the second sub-electrode and the second outer layer electrode, the second sub-electrode is in contact with the light-emitting component, the second dielectric material layer and the second sub-electrode completely cover a light-emitting region of the light-emitting component, the second outer layer electrode completely covers the second dielectric material layer, and in a non-light-emitting region on a periphery of the light-emitting component, the second outer layer electrode is electrically connected to the second sub-electrode;

wherein an auxiliary electrode layer is disposed on a side of the second sub-electrode facing away from the light-emitting component, wherein a thickness of the auxiliary electrode layer is greater than a thickness of the second sub-electrode.

14. The organic electroluminescent device according to claim 13, wherein a coverage area of the second dielectric material layer is greater than an area of the light-emitting region of the light-emitting component, and the second dielectric material layer is located within a coverage region of the second sub-electrode on the light-emitting component.

15. The organic electroluminescent device according to claim 13, wherein the auxiliary electrode layer is a grid-shaped auxiliary electrode superimposed on the second sub-electrode.

16. The organic electroluminescent device according to claim 13, wherein a glass transition temperature Tg of the second dielectric material layer is lower than 500° C.

17. The organic electroluminescent device according to claim 13, wherein the second sub-electrode is a metal conductor having a thickness of 1-150 nm or a metal oxide conductor having a thickness of 1-150 nm.

18. The organic electroluminescent device according to claim 17, wherein the second sub-electrode has a thickness of 5-50 nm, and an outer layer electrode is a reflective outer layer electrode having a thickness of 70-500 nm.

19. The organic electroluminescent device according to claim 18, wherein the second dielectric material layer is an organic semiconductor or an organic insulator, and the second sub-electrode each is one of Al, Ag, Mg, Au, indium tin oxide (ITO) and aluminum-doped.

* * * * *